United States Patent
Chang et al.

(10) Patent No.: US 10,353,022 B2
(45) Date of Patent: Jul. 16, 2019

(54) MEASURING APPARATUS FOR ELECTROMAGNETIC PROPERTY OF MATERIAL AND MEASURING METHOD THEREOF

(71) Applicant: National Tsing Hua University, Hsinchu (TW)

(72) Inventors: Tsun-Hsu Chang, Hsinchu (TW); Wei-Syuan Wong, Hsinchu (TW); Yan-Ren Chen, Hsinchu (TW); Hsien-Wen Chao, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 201 days.

(21) Appl. No.: 15/476,711

(22) Filed: Mar. 31, 2017

(65) Prior Publication Data
US 2018/0120388 A1     May 3, 2018

(30) Foreign Application Priority Data
Nov. 3, 2016   (TW) .............................. 105135703 A

(51) Int. Cl.
*G01R 33/12*    (2006.01)

(52) U.S. Cl.
CPC ................. *G01R 33/1223* (2013.01)

(58) Field of Classification Search
CPC .... G01R 33/1223; G01R 33/12–33/14; G01N 15/082; G01N 15/08–15/0826
See application file for complete search history.

(56) References Cited

U.S. PATENT DOCUMENTS

| | | | |
|---|---|---|---|
| 5,389,875 A * | 2/1995 | Rosen | G01B 7/10 324/226 |
| 6,943,286 B1 | 9/2005 | Kurihara et al. | |
| 8,633,686 B1 * | 1/2014 | Sudhoff | G01R 33/14 324/223 |
| 9,341,558 B1 | 5/2016 | Khan | |
| 2004/0187560 A1 | 9/2004 | Cholet | |
| 2005/0145358 A1 | 7/2005 | Ischdonat et al. | |
| 2008/0169805 A1 | 7/2008 | Cho | |

(Continued)

FOREIGN PATENT DOCUMENTS

| | | |
|---|---|---|
| TW | 200605108 | 2/2006 |
| TW | 201129308 | 8/2011 |
| TW | 201619618 | 6/2016 |

OTHER PUBLICATIONS

"Office Action of Taiwan Counterpart Application," dated Feb. 14, 2017, p. 1-p. 4, in which the listed references were cited.

*Primary Examiner* — Huy Q Phan
*Assistant Examiner* — David B Frederiksen
(74) *Attorney, Agent, or Firm* — J.C. Patents

(57) ABSTRACT

A measuring apparatus for electromagnetic property of material includes a chamber and a specified shielding piece. The chamber has a cavity inside and the chamber has an electromagnetic wave access terminal to connect to the cavity, used to receive an input electromagnetic wave and output a reflective electromagnetic wave. The specified shielding piece is disposed inside the cavity with respect to the electromagnetic wave access terminal, used to produce a region in side the cavity. The region is dominated by magnetic field and is used to adapt an object to be measured.

10 Claims, 9 Drawing Sheets

(56) References Cited

U.S. PATENT DOCUMENTS

| | | | |
|---|---|---|---|
| 2009/0102458 A1* | 4/2009 | Ledieu | G01R 33/1223 |
| | | | 324/201 |
| 2011/0057653 A1* | 3/2011 | Barmatz | G01R 33/1223 |
| | | | 324/316 |
| 2015/0035522 A1* | 2/2015 | Ebnabbasi | G01R 33/1223 |
| | | | 324/239 |
| 2015/0123754 A1* | 5/2015 | Yu | G01R 33/093 |
| | | | 335/296 |
| 2016/0146742 A1* | 5/2016 | Chang | G01N 22/00 |
| | | | 324/633 |
| 2016/0178710 A1* | 6/2016 | Fidler | G01N 27/745 |
| | | | 324/239 |
| 2016/0299104 A1* | 10/2016 | Gunawan | G01N 27/72 |

\* cited by examiner

MEASURING APPARATUS FOR ELECTROMAGNETIC PROPERTY OF MATERIAL AND MEASURING METHOD THEREOF

CROSS-REFERENCE TO RELATED APPLICATION

This application claims the priority benefit of Taiwan application serial no. 105135703, filed on Nov. 3, 2016. The entirety of the above-mentioned patent application is hereby incorporated by reference herein and made a part of this specification.

BACKGROUND

1. Field of the Invention

The present invention generally relates to the techniques to measure electromagnetic property of a material, in particular the permeability coefficient ($\mu$) of an electromagnetic material.

2. Description of Related Art

Material characterization is always an essential and practical issue. Before a material is intended to be used, the material properties should be known first. Usually, the material property changes with different external electromagnetic effect, so the material property is not just a constant value but the responsive performance in interacting with the electromagnetic field. Although the responsive performance is usually complicated, it can basically be described by the permittivity coefficient ($\varepsilon$) and the permeability coefficient ($\mu$). The capability of precise material characterization is always needed by the ones in the related art for further development.

The material intrinsically carries the permittivity coefficient ($\varepsilon$) and the permeability coefficient ($\mu$) and would be coupling with each other under the external electromagnetic effect. For the conventional techniques to measure the material property, the permittivity coefficient ($\varepsilon$) is relatively easy to be measured. However, it is complicated and not easy for the current technology to precisely measure the permeability coefficient ($\mu$) above the GHz band. The capability of precise material characterization is an intended goal for the industry applications and researchers in the related art.

SUMMARY OF THE INVENTION

The present invention provides a measuring apparatus for electromagnetic property of material and measuring method thereof, which can improve the measurement on the $\mu$ value. Two different chamber measuring apparatuses are respectively used to measure the $\mu$ value and the $\varepsilon$ value. Then, an iteration estimation mechanism between the two chamber measuring apparatuses is performed to improve the measurement of the $\mu$ value and the $\varepsilon$ value. The electromagnetic property of the material can include the electromagnetic property of microwave material.

The invention provides a measuring apparatus for electromagnetic property of material including a chamber and a specified structural piece. The chamber has a cavity inside, wherein the chamber has an electromagnetic wave access terminal to connect to the cavity, used to receive an input electromagnetic wave and output a reflective electromagnetic wave. The specified structural piece is disposed inside the cavity with respect to the electromagnetic wave access terminal and used to produce a field region inside the cavity. The region is dominated by a magnetic field and is used to adapt an object to be measured.

For an embodiment in the measuring apparatus, a periphery of the cavity comprises an upper surface and a lower surface, being parallel and identical shape.

For an embodiment in the measuring apparatus, the specified structural piece comprises a disc piece and a supporting cylinder to form a specific structure, wherein the region is formed at one side of the disc piece and is opposite to the electromagnetic wave access terminal.

For an embodiment in the measuring apparatus, the cavity is a cylindrical cavity.

For an embodiment in the measuring apparatus, the specified structural comprises a disc and a supporting cylinder to form a specific structure, wherein the region is formed at one side of the disc piece and is opposite to the electromagnetic wave access terminal.

For an embodiment in the measuring apparatus, a shape of the object to be measured is a hollow cylinder or a hollow disc, the supporting cylinder passes through and fixes the object to be measured.

The invention also provides a measuring system for electromagnetic property of material, at least suitable for use in measuring a permeability coefficient ($\mu$) value of an object to be measured. The system comprises the measuring apparatus as recited above, serving as a first chamber measuring apparatus, used to measure a first resonant frequency of the object to be measured at a first geometric structure. A second chamber measuring apparatus is used to measure a second resonant frequency of the object to be measured at a second geometric structure. A first data bank comprises a plurality of first curves, wherein each of the first curves has been simulated at resonant frequencies with $\mu$-value variances according to the first geometric structure in the first chamber measuring apparatus, wherein the first curves are respectively corresponding to different values of permittivity coefficient ($\varepsilon$). A second data bank comprises a plurality of second curves, wherein each of the second curves has been simulated at resonant frequencies with $\varepsilon$-value variances according to the second geometric structure in the second chamber measuring apparatus, wherein the second curves are respectively corresponding to different values of permeability coefficient ($\mu$). A processing unit, according to the first resonant frequency and the second resonant frequency and according to the first data bank and the second data bank, obtaining a first-order estimated $\mu$ value from the first data bank with respect to a given $\varepsilon$ value, and obtaining a first-order estimated $\varepsilon$ value from the second data bank with respect to the first-order estimated $\mu$ value, and further obtaining a second-order estimated $\mu$ value from the first data bank with respect to the first-order estimated $\varepsilon$ value. The second-order estimated $\mu$ value serves as a measured $\mu$ value for the object to be measured. Or, at least a second-order estimated $\varepsilon$ value is obtained from the second data bank with respect to the second-order estimated $\mu$ value, and a third-order estimated $\mu$ value from the first data bank with respect to the second-order estimated $\varepsilon$ value, wherein after performing n times of estimation a n-order estimated $\mu$ value is obtained, where n is equal to or greater than 1.

For an embodiment in the measuring system, a periphery of the cavity of the first chamber measuring apparatus comprises an upper surface and a lower surface, being parallel and identical shape.

For an embodiment in the measuring system, the specified structural piece of the first chamber measuring apparatus comprises a disc piece and a supporting cylinder to form a specific structure, wherein the region is formed at one side of the disc piece and is opposite to the electromagnetic wave access terminal.

For an embodiment in the measuring system, the cavity of the first chamber measuring apparatus is a cylindrical cavity.

For an embodiment in the measuring system, the specified structural piece of the first chamber measuring apparatus comprises a disc piece and a supporting cylinder to form a specific structure, wherein the region is formed at one side of the disc piece and is opposite to the electromagnetic wave access terminal.

For an embodiment in the measuring system, a shape of the object to be measured in the first chamber measuring apparatus is a hollow cylinder or a hollow disc, the supporting cylinder passes through and fixes the object to be measured.

For an embodiment in the measuring system, the second chamber measuring apparatus also comprises a cavity and a measuring region used to adapt the object to be measure with the second geometric structure.

The invention also provides a method for measuring electromagnetic property of material, at least suitable for measuring permeability coefficient ($\mu$) value of an object to be measured. The method comprises obtaining a first chamber measuring apparatus and a second chamber measuring apparatus, wherein the first chamber measuring apparatus is the measuring apparatus as previously recited. A first data bank is obtained, wherein the first data bank is pre-established up and comprises a plurality of first curves, wherein each of the first curves has been simulated at resonant frequencies (f) with $\mu$-value variances according to the first geometric structure in the first chamber measuring apparatus, wherein the first curves are respectively corresponding to different values of permittivity coefficient ($\epsilon$) of the object to be measured. A second data bank is obtained, wherein the first data bank is pre-established up and comprises a plurality of second curves, wherein each of the second curves has been simulated at resonant frequencies (f) with $\epsilon$-value variances according to a second geometric structure in the second chamber measuring apparatus, wherein the second curves are respectively corresponding to different values of permeability coefficient ($\mu$). The object to be measured is formed into a first geometric structure and a second geometric structure. The first chamber is used for measuring apparatus to measure a first resonant frequency of the object to be measured at the first geometric structure. The second chamber is used for measuring apparatus to measure a second resonant frequency of the object to be measured at the second geometric structure. A processing unit is used, according to the first resonant frequency and the second resonant frequency and according to the first data bank and the second data bank, to obtain a first-order estimated $\mu$ value from the first data bank with respect to a given $\epsilon$ value, and obtain a first-order estimated $\epsilon$ value from the second data bank with respect to the first-order estimated $\mu$ value, and further obtain a second-order estimated $\mu$ value from the first data bank with respect to the first-order estimated $\epsilon$ value. The second-order estimated $\mu$ value serves as a measured $\mu$ value for the object to be measured. Or, at least a second-order estimated $\epsilon$ value is obtained from the second data bank with respect to the second-order estimated $\mu$ value, and a third-order estimated $\mu$ value from the first data bank with respect to the second-order estimated $\epsilon$ value, wherein after performing n times of estimation a n-order estimated $\mu$ value is obtained, where n is equal to or greater than 1.

For an embodiment in the measuring electromagnetic property of material, the steps to establish up the first data bank comprises simulating a $\mu$-f curve of the resonant frequencies (f) versus $\mu$ values with respect to each one of different $\epsilon$ values in the first chamber measuring apparatus, and so obtaining the first curves. The steps to establish up the second data bank comprises simulating an $\epsilon$-f curve of the resonant frequencies (f) versus $\epsilon$ values with respect to each one of different $\mu$ values in the second chamber measuring apparatus, and so obtaining the second curves.

For an embodiment in the measuring electromagnetic property of material, the step of using the processing unit comprises: a $\mu$-value estimation step comprising: determining a given $\epsilon$ value, given to the object to be measure; and obtaining a corresponding $\mu$-f curve from the first data bank with respect to the given $\epsilon$ value as given and obtaining the estimated $\mu$ value according to the first resonant frequency. Further, an $\epsilon$-value estimation step comprises: determining a given $\mu$ value, given to the object to be measure; and obtaining a corresponding $\epsilon$-f curve from the second data bank with respect to the given $\mu$ value as given and obtaining the estimated $\epsilon$ value according to the second resonant frequency. An iteration estimation step comprises: taking the estimated $\epsilon$ value as the given $\epsilon$ value to perform the $\mu$-value estimation step; and taking the estimated $\mu$ value as the given $\mu$ value to perform the $\epsilon$-value estimation step. Wherein, the given $\mu$ value is taken as the measured $\mu$ value according to a number of iterations as preset.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
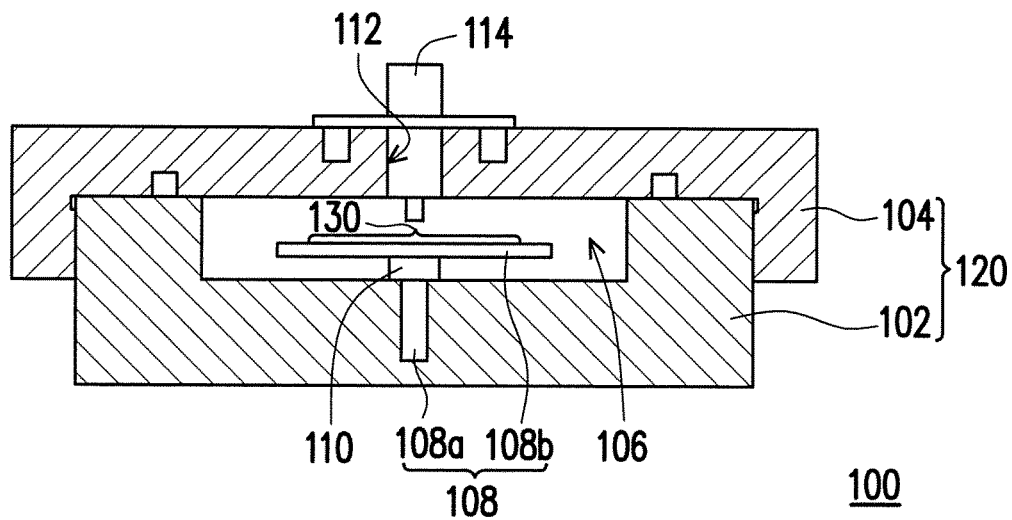
FIG. 1 is a cross-sectional drawing, schematically illustrating a cross-sectional view of a measuring apparatus for electromagnetic property of material, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

First to state, to describe the geometrical relation of the structure, the terms of "upper" and "lower" may be used to distinguish the elements. So, the terms of "upper" and "lower" are just for the relative location but not the absolute locations in the space.

The invention proposes a technology capable of precisely measuring the μ value of material. In addition, it can even further associate with a measuring apparatus for ε value, so to form a measuring system with two cavities in different geometric shapes to measure the μ value of material and improve the precision of the μ value as measured.

The invention is suitable for application in the industry for microwave band, including the frequency band of 2.45 GHz, which is a popular band and has been widely used. The invention can precisely measure the property of microwave material at this frequency band. The invention uses the different field distributions and different boundary conditions in different resonant cavity, so to be able to let the object to be measured in the cavity be more sensitive to electric field or the magnetic field. In this manner, the permittivity coefficient (ε) and the permeability coefficient (μ) can be respectively measured with improved precision, in which the coupling effect between these two material properties in measurement can be reduced.

Remarkably, the material applicable in the invention is not limited to the microwave material. The invention can be applied to the material with the electromagnetic property. However, the microwave is the frequency band wildly used with various applications. The microwave material is taken as the example in the embodiments just for descriptions. Generally, the microwave as mention can be extending to the electromagnetic wave in a reasonable range.

In experiment, the material of $Fe_3O_4$, carbonyl ion, or nano-silver can be taken as the example of the measuring sample for verifying the measuring effects of the measuring chamber. It can verify the μ-value measuring apparatus of the invention can have precise measurement.

In addition, when the two chamber models for respectively measure the μ-value and the ε-value can be used to reference to each other under the iteration mechanism, so that the precision for the μ-value and the ε-value can be further improved. The invention takes the simulation software of High Frequency Structure Simulator, HFSS as the example but the invention is not limited to this, and can take other simulation software.

The invention has proposed microwave chamber structure for measuring the μ-value of material. The design for the μ chamber structure includes the design to create a region in the space of the chamber by a "specified structural piece", in which the magnetic field is dominated in this region. After the electric field is effectively shielded, the strength is substantially reduced. As a result, the material sample can disposed in this region to perform the measurement of μ value with better precision. The specified structural piece stated above can be the conductive material and the structure is an umbrella-like structure. The umbrella-like structure in an example includes a disc and a supporting cylinder. The supporting cylinder supports the disc at the central region and then is fixed to the bottom of the chamber.

Several embodiments are provided for describing the invention, but the invention is not just limited to the embodiments as provided.

Figure 2:
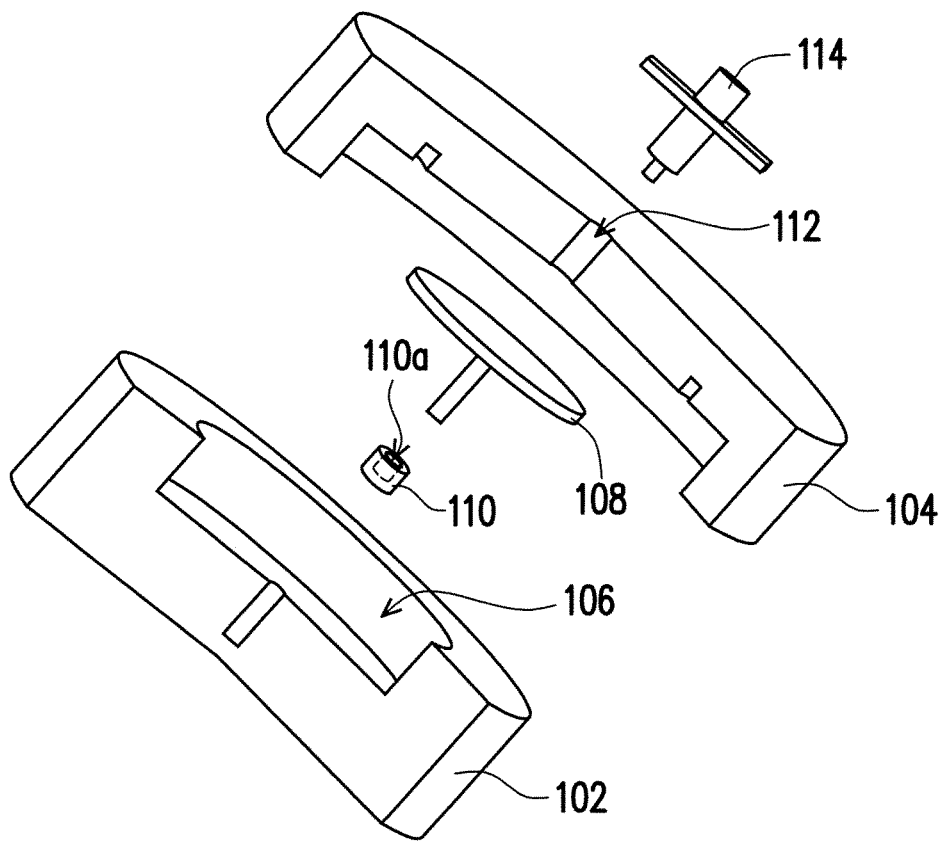
FIG. 2 is a drawing, schematically illustrating an exploded view of a measuring apparatus for electromagnetic property of material, according to an embodiment of the invention.

The measuring apparatus suitable for measuring the μ value of microwave material property is described first. FIG. 1 is a cross-sectional drawing, schematically illustrating a cross-sectional view of a measuring apparatus for electromagnetic property of material, according to an embodiment of the invention. FIG. 2 is a drawing, schematically illustrating an exploded view of a measuring apparatus for electromagnetic property of material, according to an embodiment of the invention.

Referring to FIG. 1 and FIG. 2, the first chamber measuring apparatus 100, used to measure the property of microwave material, includes a chamber 120 and a specified structural piece 108. The specified structural piece 108 in an example can be a conductive piece or a material piece with high dielectric constant. The chamber 120 has a cavity 106 inside and the chamber 120 has microwave access terminal 114 connected with the cavity 106, so to receive an input microwave and output a reflective microwave. The specified structural piece 108 is disposed inside the cavity 106, with respect to the microwave access terminal 114 and is used to create a region 130 inside the cavity 106. This region 130 is a central region between the disc 108b and the lower chamber piece 102, and is mainly occupied by the magnetic field, as to be further described in FIG. 4. The region 130 is used to adapt an object 110 to be measured.

The material of the chamber 120 is a conductive material in an example, and further the brass in an example. The chamber 120 is composed by the lower chamber piece 102 and the upper chamber piece 104. The lower chamber pieces 102 has a concave region with a predetermine shape. The upper chamber piece 104 has also a concave region. When the upper chamber piece 104 with the concave region covers over the lower chamber piece 102, the concave region of the lower chamber piece 102 forms the cavity 106. To easily establish up the electromagnetic filed model, a periphery of the cavity includes an upper surface and a lower surface, being parallel and identical shape. In other words, a sidewall of the concave region of the lower chamber piece 102 is perpendicular. The upper surface is a portion of the bottom of the concave region of the upper chamber piece 104 and the lower surface is the bottom of the concave region of the lower chamber piece 102. In other words, the periphery shape of the cavity 106 is like a cylinder shape. A cross-section of the cylinder can be circular elliptic, square, rectangular or polygonal column and so on. It can take any shape helpful for establish up the electromagnetic field distribution. Wherein, the cavity shape preferably is a round cylinder. In addition, depending on the length of cylinder, it can also be treated as a disc. In other words, the invention is not limited to a specific size.

The specified structural piece 108 is disposed in side the cavity 106. The material of the specified structural piece 108 is the same as the material of the chamber 120, as an example, such as brass. However, in other embodiments, the other metallic material can also be used without limitation to the same material.

The geometric structure of the specified structural piece 108 is umbrella-like in an example, including a disc 108*b* and a supporting cylinder 108*a* to form the specified structural piece 108. The region 130 is at one side of the disc 108*b*, opposite to the microwave access terminal 114. The supporting cylinder 108*a* has one end, inserted into the lower chamber piece 102, so to thereby fix the disc 108*b* in location. Further, since the supporting cylinder is also conductive, it produces the effect of boundary condition for the microwave and is helpful to create the region 130 for disposing the object 110 to be measured and then the magnetic field would dominate the region as to be described in better detail later.

Further, as to the cavity 106 with a cylinder shape, the specified structural piece 108 is a disc 108*b*, such as round disc plate, and is supported by the supporting cylinder 108*a*, such as round column. The geometric structure for the thickness and the area size of the disc 108*b* and the location of the disc 108*b* inside the cavity 106, and so on can be adjusted according to the actual design without limited to a specific dimension.

In addition, the object 110 to be measured is implemented at the lower side of the disc 108*b*, so the object 110 to be measured is also a hollow cylindrical structure. Depending on the length of the cylindrical structure, it can also be treated as a hollow disc. The invention generally refers as the cylinder without limiting to the thickness/length. The through hole 110*a* of the object 110 to be measured allows the supporting cylinder 108*a* to pass through and fix the object 110 to be measured.

The upper chamber piece 104 has a through hole 112, used to implement the microwave access terminal 114. The location of the through hole 112 is corresponding to the location of the supporting cylinder 108*a* in an example. The measuring microwave can be input from the microwave access terminal 114, and get resonant according to the specified structural piece 108 and the object 110 to be measured. The reflective microwave can also be measured at the microwave access terminal 114, so to determine the resonant frequency. The structure of the microwave access terminal 114 is also not limited to a specific structure.

The field distribution produced by the first chamber measuring apparatus 100 is described as follows. Due to the change of geometric structure for the cavity 106 and the specified structural piece 108, it would produce the different field distribution. However, as to the design of the specified structural piece 108, the region 130 for disposing the object 110 to be measured would be produced under the disc 108*b* due to shielding effect of the electric field.

Figure 3:
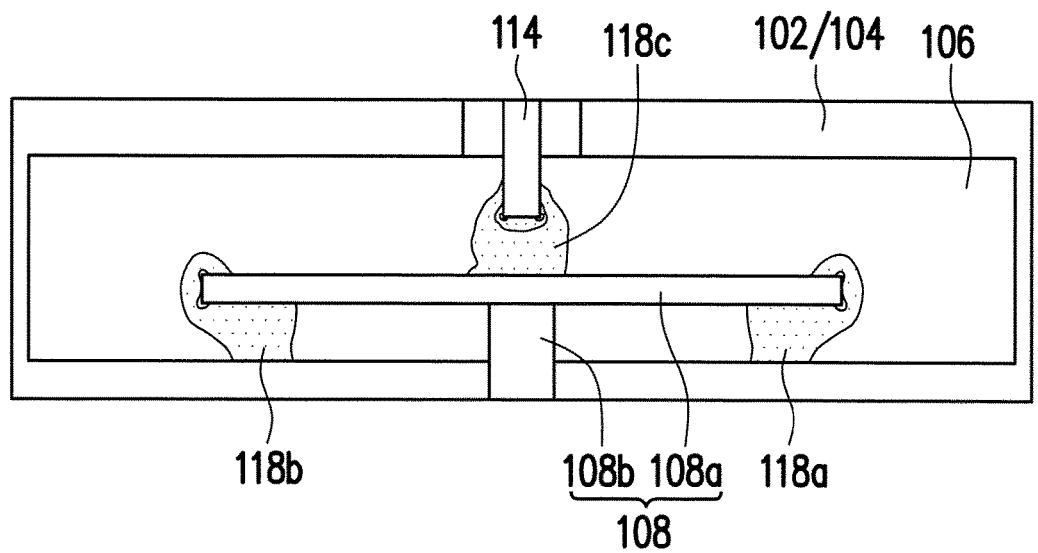
FIG. 3 is a drawing, schematically illustrating the electric field distribution in the cavity of the measuring apparatus of FIG. 1.

FIG. 3 is a drawing, schematically illustrating the electric field distribution in the cavity of the measuring apparatus of FIG. 1. Referring to FIG. 3, according to the structure of the first chamber measuring apparatus 100, the HFSS system in an example is taken for simulation to obtain the electric filed distribution. As observed from the simulation result, the electric filed is concentrated to some local regions 118*a*, 118*b*, 118*c*, and the electric field strength under the disc 108*b* is relative low, having reached to the level for neglect.

Figure 4:
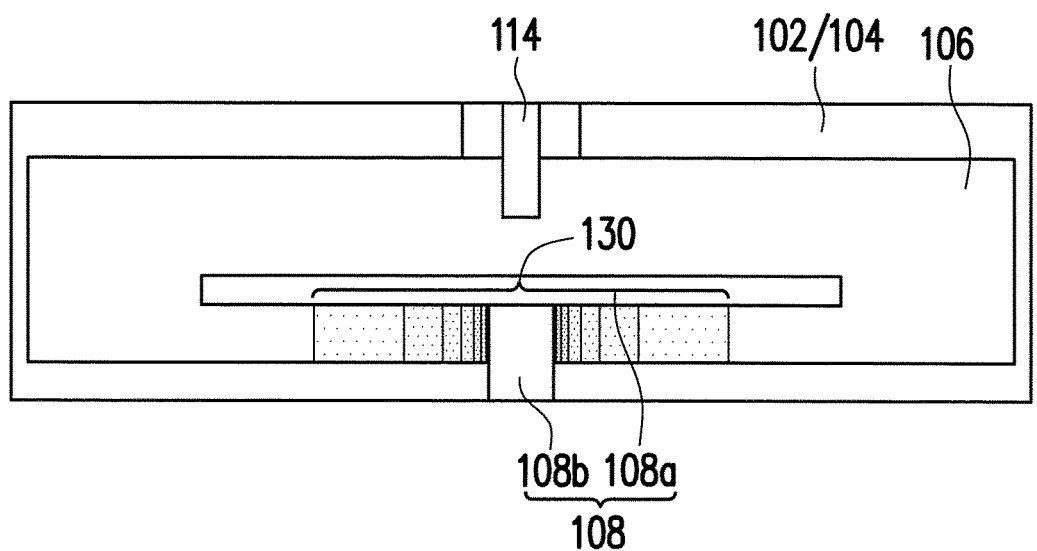
FIG. 4 is a drawing, schematically illustrating the magnetic field distribution in the cavity of the measuring apparatus of FIG. 1.

FIG. 4 is a drawing, schematically illustrating the magnetic field distribution in the cavity of the measuring apparatus of FIG. 1. Referring to FIG. 4, the HFSS system in an example is taken for simulation to obtain the magnetic field distribution. According to the simulation result, it can be observed that the magnetic field is concentrate to the region 130 under the disc 108*b*. The magnetic field strength in this region 130 is expressed by the vertical lines with density in an example. The peripheral region of the supporting cylinder 108*a* has relatively stronger magnetic field. As a result, as the general consideration from FIG. 3 and FIG. 4, the region 130 can be taken to dispose the object 110 to be measured for measuring the $\mu$ value. The $\mu$ value of the object 110 to be measured is relating to the resonant frequency. When the resonant frequency is obtained by measuring the reflective signal at the microwave accessing terminal 114, the $\mu$ value of the object 110 to be measured can be obtained from the data bank as simulated.

Sine the change of geometric structure for the cavity 106 and the specified structural piece 108 would change the field distribution, under the aspect of the invention, the structure and the size can be modified to obtain the suitable field distribution. The invention is not limited to the specific size.

Figure 5:
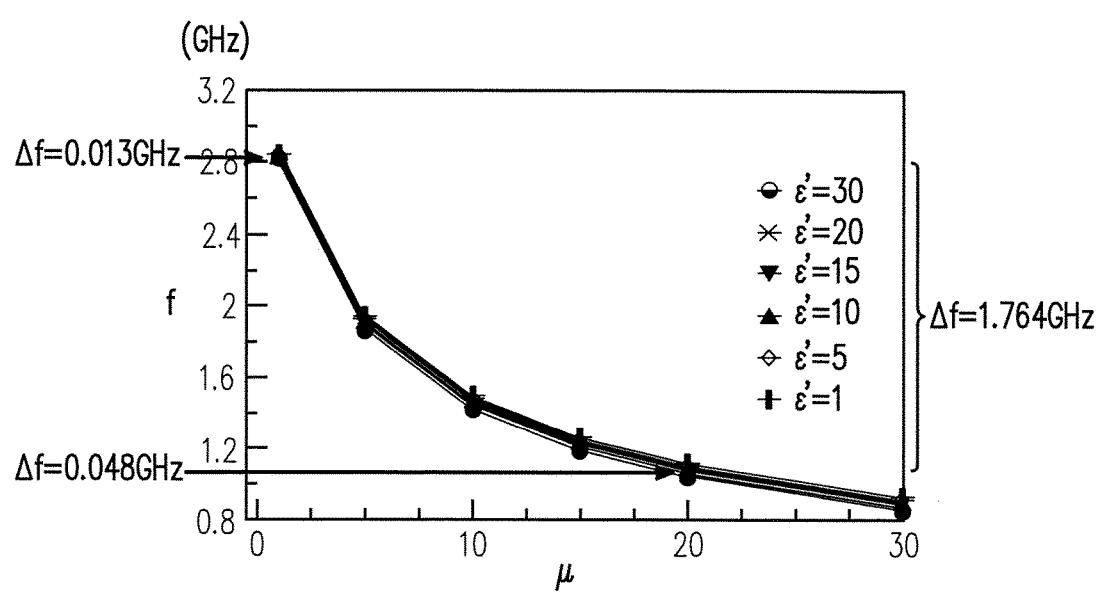
FIG. 5 is a drawing, schematically illustrating a variance curve for the $\mu$ value versus the resonant frequency f in the measuring apparatus of FIG. 1, according to an embodiment of the invention.

FIG. 5 is a drawing, schematically illustrating a variance curve for the $\mu$ value versus the resonant frequency f in the measuring apparatus of FIG. 1, according to an embodiment of the invention. Referring to FIG. 5, based on the measuring structure as shown in FIG. 1 and after the simulation by HFSS system, the relation curve for the $\mu$ value versus the resonant frequency f with respect to various $\epsilon$ values for the object 110 to be measured can be established up as a data bank, called the curves. FIG. 5 in the example has six $\mu$-f curves with respect to the $\epsilon'$ values of 1, 5, 10, 15, 20 and 30 as the example. Here, the density of the data points can be produce according to the actual need. The other values not located at the data points can be obtained by interpolation, or estimated by referring to the adjacent multiple data points.

Since the characteristics of the first chamber measuring apparatus 100 can produce the region dominated by the magnetic field component, the effect from the $\epsilon$ values is relatively small and therefore the six $\mu$-f curves are quite close to each other. The variance of the resonant frequency for the $\mu$-f curves roughly ranging from $\epsilon=1$ to $\epsilon=30$ is about in a range of 1.764 GHz. However, with respect to a $\mu$ value, the changing range of the resonant frequency caused by the $\epsilon$ value is not large. For example, when the $\mu$ value is small, closing to 1, the variance range of the resonant frequency is 0.013 GHz as an example. Further when the $\mu$ value is large, closing to 20, the variance range of the resonant frequency is 0.048 GHz as an example. As a result, the first chamber measuring apparatus 100 can obtain $\mu$ value according to the resonant frequency by a precision level within an acceptable range.

However, if the $\mu$ value needs to be estimated in better precision, the invention also proposes to take dual-chamber measurement and perform an iteration operation with the inter-relation, so to obtain the $\mu$ value with better precision, in which the measurement of the $\epsilon$ value can also be improved. The dual-chamber iteration mechanism takes the first chamber measuring apparatus 100 as the model for measuring the first-order $\mu$ value and also takes a second chamber measuring apparatus to perform the $\epsilon$ value measurement.

Figure 6:
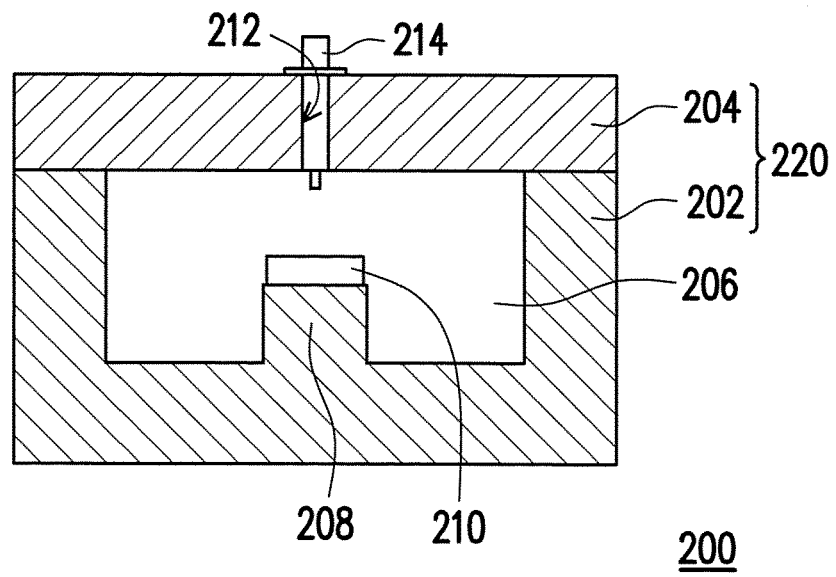
FIG. 6 is a drawing, schematically illustrating a cross-sectional view of a measuring apparatus for electromagnetic property of material, according to an embodiment of the invention.
Figure 7:
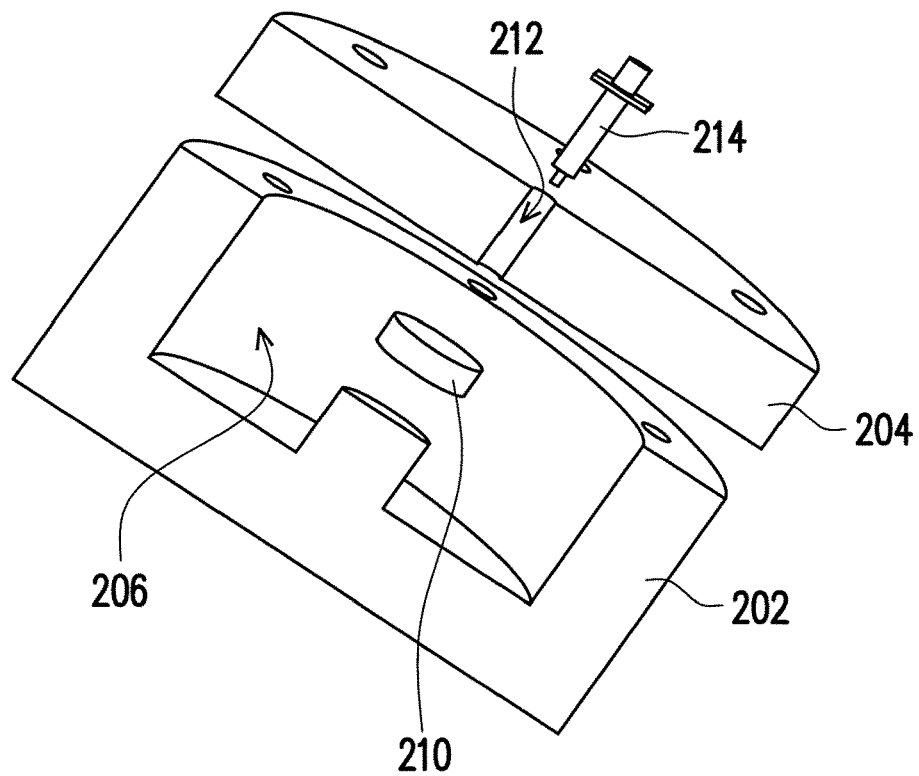
FIG. 7 is a drawing, schematically illustrating an exploded view of a measuring apparatus for electromagnetic property in FIG. 6, according to an embodiment of the invention.

The second chamber measuring apparatus is described first in the following. FIG. 6 is a drawing, schematically illustrating a cross-sectional view of a measuring apparatus for electromagnetic property of material, according to an embodiment of the invention. FIG. 7 is a drawing, schematically illustrating an exploded view of a measuring apparatus for electromagnetic property in FIG. 6, according to an embodiment of the invention. Referring to FIGS. 6 and 7, the second chamber measuring apparatus 200 is to measure the ε value of the object 210 to be measured. The second chamber measuring apparatus 200 includes a chamber 220. The chamber 220 includes a lower chamber piece 202 and an upper chamber piece 204. The lower chamber piece 202 has a concave region as predetermined to form a cavity 206. The lower chamber piece 202 also has a protruding column 208 within the cavity 206. The object 210 to be measured is fabricated into a disc shape in accordance with the protruding column 208, and is disposed on top of the protruding column 208. The upper chamber piece 204 in an example is a structure of round cap, to cover over the lower chamber piece 202 and seal the concave region of the lower chamber piece 202, so to form the cavity 206. A center of the upper cavity 204 also has a through hole 212, allowing to adapt the microwave access terminal 214. The microwave access terminal 214 is connected to the cavity 206 and used to receive an input microwave and output a reflective microwave.

The structure of the second chamber measuring apparatus 200 is also designed according to the simulation by the HFSS, so that the electric field component can be created around the object 210 to be measured but the electric field component in an example is about equal to or lager than the magnetic field component, relatively. However, the second chamber measuring apparatus 200 is used to measure the ε value.

Figure 8:
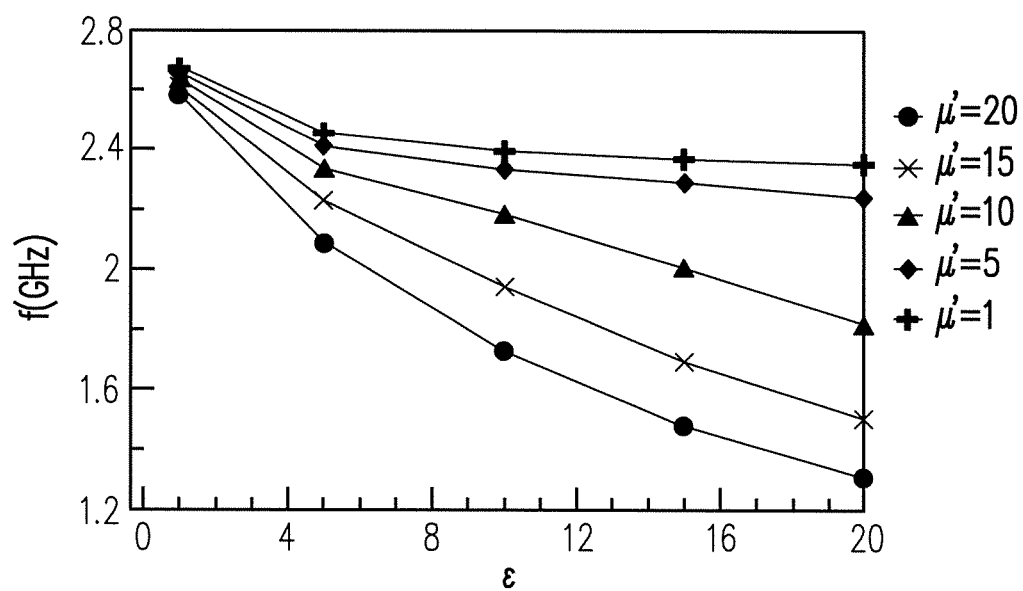
FIG. 8 is a drawing, schematically illustrating a variance curve for the ε value versus the resonant frequency f in the measuring apparatus of FIG. 6, according to an embodiment of the invention.

The measuring mechanism of the second chamber measuring apparatus 200 is described as follows. FIG. 8 is a drawing, schematically illustrating a variance curve for the ε value versus the resonant frequency f in the measuring apparatus of FIG. 6, according to an embodiment of the invention. Referring to FIG. 8, the second chamber measuring apparatus 200 in accordance with the structure of the object 210 to be measured is simulated by the HFSS system, so to obtain multiple ε-f curves corresponding to multiple different μ values. In the embodiment, the μ' values is 1, 5, 10, 15 and 20 as the examples but the invention is not limited to thereof. The data points in FIG. 8 are used to form the second data bank. The density of the data points is determined according to the actual need.

Since the microwave field distribution in the second chamber measuring apparatus 200 does not require a region, which is dominated by the electric field, the ε-f curves have large frequency variance with respect to different μ values. However, the frequency variances with respect to the μ values when ε value is close to 1 are still remaining in a small range.

Remarkably, the material of the second chamber measuring apparatus 200 can be brass in an example, but the invention is not limited to brass. Further similar to the first chamber measuring apparatus 100, the cross-section shape is not limited to circle.

Figure 9:
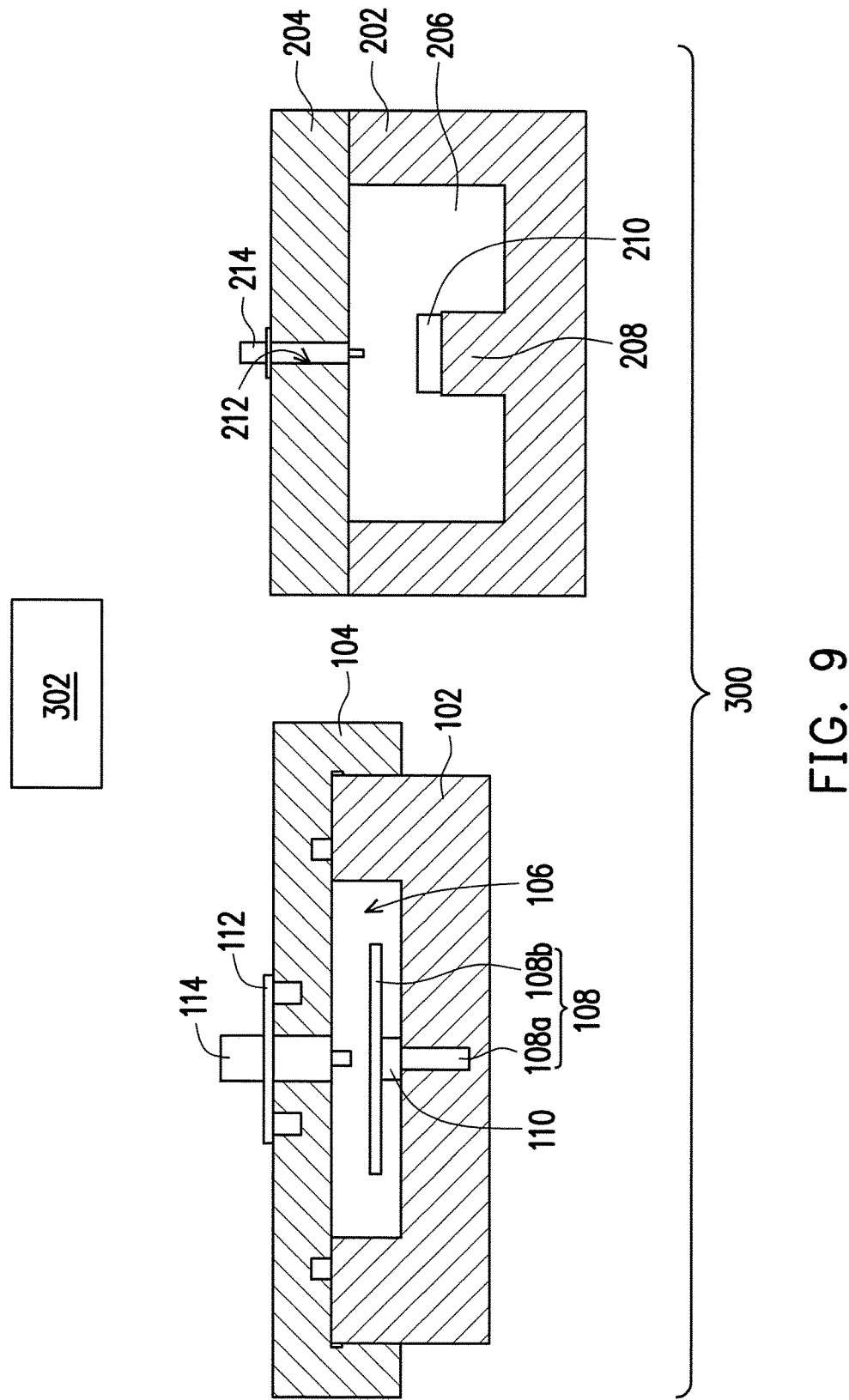
FIG. 9 is a drawing, schematically illustrating a measuring system, according to an embodiment of the invention.

The measuring system for electromagnetic property of material is described in the following, including the first chamber measuring apparatus 100 and the second chamber measuring apparatus 200 as previously described. FIG. 9 is a drawing, schematically illustrating a measuring system, according to an embodiment of the invention. Referring to FIG. 9, the measuring system 300 for electromagnetic property of material includes the first chamber measuring apparatus 100 and the second chamber measuring apparatus 200. Here, the object 110 to be measured and the object 210 to be measure are the same material but in different shapes.

The first chamber measuring apparatus 100 is used to measure a first resonant frequency $f_\mu$ for the object 110 to be measured at a first geometric structure. The second chamber measuring apparatus 200 is used to measure a second resonant frequency $f_\epsilon$ for the object 210 to be measured at a second geometric structure. Here, the object 110 to be measured and the object 210 to be measure are the same material but fabricated into different geometric structures with respect to the different models for the first chamber measuring apparatus 100 and the second chamber measuring apparatus 200.

A first data bank, as the data shown in FIG. 5, comprises a plurality of first curves, wherein each of the first curves has been simulated at resonant frequencies f with μ-value variances according to the first geometric structure of the object 110 to be measured in the first chamber measuring apparatus 100. The first curves are respectively corresponding to different values of permittivity coefficient (ε). The second data bank, as the data shown in FIG. 8, comprises a plurality of second curves, wherein each of the second curves has been simulated at resonant frequencies with ε-value variances according to the second geometric structure of the object 210 to be measured in the second chamber measuring apparatus 200, wherein the second curves are respectively corresponding to different values of permeability coefficient (μ).

A processing unit 302, according to the first resonant frequency $f_\mu$ and the second resonant frequency $f_\mu$ and according to the first data bank and the second data bank, obtains a first-order estimated μ value from the first data bank with respect to a given ε value such as ε=1, and obtains a first-order estimated ε value from the second data bank with respect to the first-order estimated μ value, and further obtains a second-order estimated μ value from the first data bank with respect to the first-order estimated ε value. Wherein, the second-order estimated μ value serves as a measured μ value for the object to be measured. Or, at least a second-order estimated ε value is obtained from the second data bank with respect to the second-order estimated μ value, and a third-order estimated μ value from the first data bank with respect to the second-order estimated ε value. After performing n times of estimation, a n-order estimated μ value is obtained, where n is equal to or greater than 1.

Figure 10:
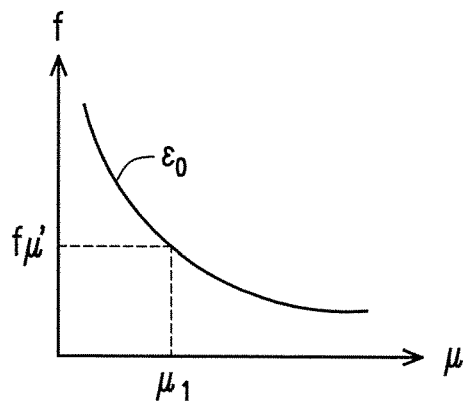
FIG. 10 to FIG. 14 are drawings, schematically illustrating the measuring mechanism with dual chambers, according to an embodiment of the invention.

An embodiment is provided in the following for describing the measuring mechanism as stated above in better detail. FIG. 10 to FIG. 14 are drawings, schematically illustrating the measuring mechanism with dual chambers, according to an embodiment of the invention. Referring to FIG. 10, the first chamber measuring apparatus 100 adapts the object 110 to be measured by a first geometric structure and can measure the first resonant frequency $f_\mu'$. After then, according to the data bank as for example shown in FIG. 5, a corresponding f-μ curve with respect to a given ε0 value is obtained. Here, the $\epsilon_0$ value can be any one in the data bank without limitation, but $\epsilon_0=1$ can be taken for start according to the data banks in FIG. 5 and FIG. 8. As a result, the f-μ curve with respect to $\epsilon_0=1$ is taken and the μ value of the object 110 to be measured is $\mu_1$, according to the first resonant frequency $f_\mu'$ as measured, in which the interpolation operation can be taken for estimation according to the density of data points, but the invention is not limited to the specific interpolation or a corresponding manner. The $\mu_1$ value is the first-order μ value. The $\epsilon_0$ value can also be selected from the middle value of the range in the data bank without limitation. The precision of the first-order μ value can be within 10% in an example, but this value determined from the field distribution induced by the structure of the first chamber measuring apparatus 100. However, since the electric field component in the measuring region is greatly suppressed and the sufficient strength of magnetic field is reserved, this is helpful for measuring the μ value. If the precision is not required to be high, then the first-order μ value, that is, $\mu_1$ value can serve as the measuring result from the first chamber measuring apparatus 100.

Figure 11:
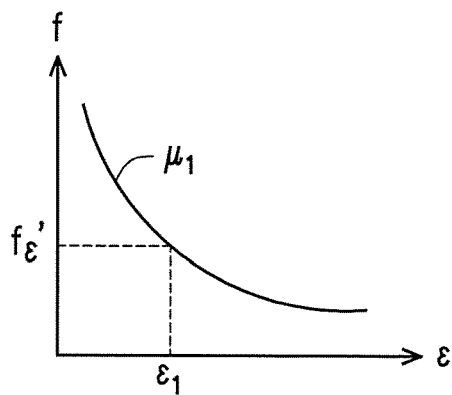

If the precision is required to be high, the invention then takes measuring mechanism with dual chambers by iteration operation. Referring to FIG. 11, the measuring mechanism with dual chambers includes the measurement using the second chamber measuring apparatus 200 and the establishment of the second data bank as for example shown in FIG. 8. The method for measuring electromagnetic property of material, at least suitable for measuring permeability coefficient (μ) value of an object to be measured adapts the object 210 to be measured in the second geometric structure and can measure the second resonant frequency $f_\varepsilon'$. The second chamber measuring apparatus 200 is to measure the ε value. According to the $\mu_1$ value, a f-ε curve corresponding to the $\mu_1$ value is taken form the second data bank. According to the second resonant frequency $f_\varepsilon'$, a first-order ε value, that is, $\varepsilon_1$ value is obtained. As previously described, the interpolation operation may be taken to estimate the value not at the data points. The invention is not limited to a specific manner. The interpolation operation for estimating the value not at the data points is not further described.

Figure 12:
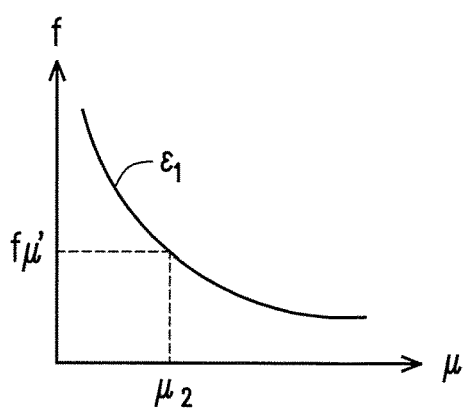

Referring to FIG. 12, like the method in FIG. 10, a next iteration operation is performed. In other words, the $\varepsilon_1$ value is taken to obtain a corresponding f-μ curve from the first data bank. The first resonant frequency $f_\mu'$ as previously measured is taken to correspondingly obtain a second-order μ value, that is, $\mu_2$ value. As a result, the precision of the μ value can be improved within 1%.

With the same iteration operation, it can be performed by n orders (n>1 or n=1) and also get converged μ value. Remarkably, when the μ value is iterated, the precision of the ε value also be improved as well. The invention is not just limited to the μ measurement. As the general applications, the ε value as the measurement can also be obtained.

Figure 13:
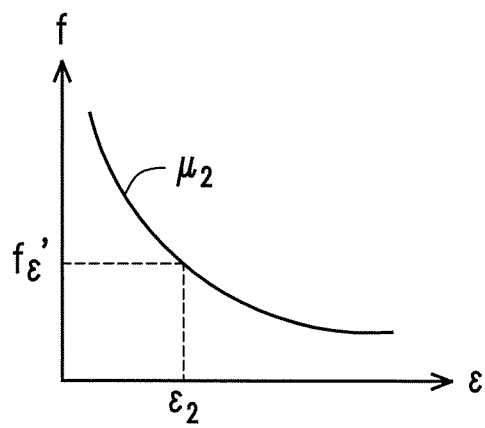
Figure 14:
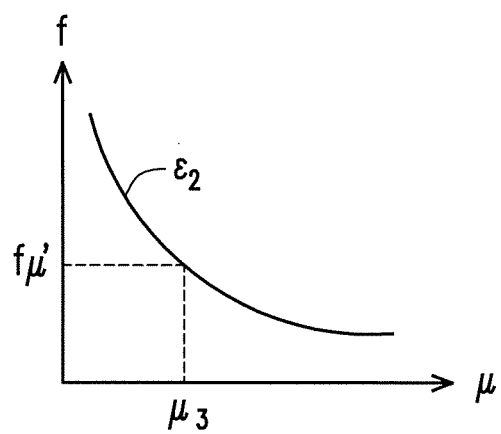

To obtain the further precision, the iteration operation to obtain the third-order μ value is described in the following. Referring to FIG. 13, according to the second-order μ value, that is, the $\mu_2$ value is taken to obtain the f-ε curve corresponding to the $\mu_2$ value from the second data bank. Then, the second-order ε value, that is, $\varepsilon_2$ value is obtained according to the second resonant frequency $f_\varepsilon'$. Referring to FIG. 14, the $\varepsilon_2$ value is taken to select a f-μ curve from the first data bank in FIG. 5. And then, the third-order μ value is obtained according to the first resonant frequency $f_\mu'$, that is, $\mu_3$ value. As such, n times of iteration operation in the same way can be performed.

According to the first chamber measuring apparatus 100 and the second chamber measuring apparatus 200, the invention provides the method for measuring electromagnetic property of material by dual chambers with iteration mechanism, at least suitable for measuring permeability coefficient (μ) value of an object to be measured.

Figure 15:
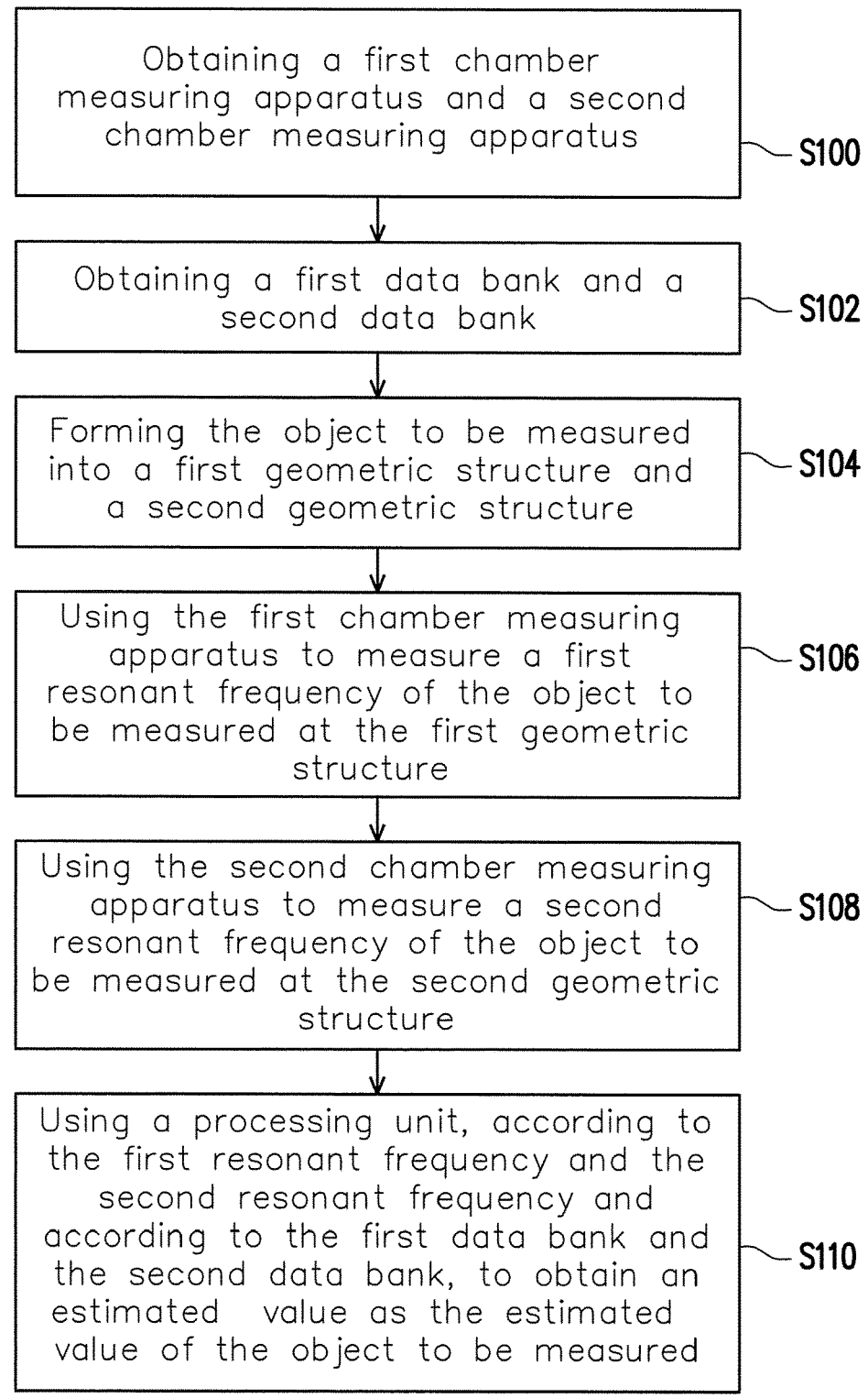
FIG. 15 is a drawing, schematically illustrating the procedure of the measuring method with dual chambers, according to an embodiment of the invention.

FIG. 15 is a drawing, schematically illustrating the procedure of the measuring method with dual chambers, according to an embodiment of the invention. Referring to FIG. 15, the method for measuring electromagnetic property of material includes the step S100, obtaining a first chamber measuring apparatus and a second chamber measuring apparatus, wherein the first chamber measuring apparatus is the measuring apparatus for electromagnetic property of material, as previously described. The measuring method further includes a step S102, obtaining a first data bank and a second data bank. The first data bank is pre-established up and comprises a plurality of first curves, wherein each of the first curves has been simulated at resonant frequencies (f) with μ-value variances according to the first geometric structure in the first chamber measuring apparatus. As shown in FIG. 5, the first curves are respectively corresponding to different values of permittivity coefficient (ε) of the object to be measured. The first data bank is pre-established up and comprises a plurality of second curves, wherein each of the second curves has been simulated at resonant frequencies (f) with ε-value variances according to a second geometric structure in the second chamber measuring apparatus. As shown in FIG. 8, the second curves are respectively corresponding to different values of permeability coefficient (μ). In step S104, the object to be measured is formed into a first geometric structure and a second geometric structure. In step S106, the method uses the first chamber measuring apparatus to measure a first resonant frequency of the object to be measured at the first geometric structure. In step S108, the method uses the second chamber measuring apparatus to measure a second resonant frequency of the object to be measured at the second geometric structure. In step S110, a processing unit is used, according to the first resonant frequency and the second resonant frequency and according to the first data bank and the second data bank, to obtain a first-order estimated μ value from the first data bank with respect to a given ε value; and further obtain a first-order estimated ε value from the second data bank with respect to the first-order estimated μ value; and further obtain a second-order estimated μ value from the first data bank with respect to the first-order estimated ε value. The second-order estimated μ value serves as a measured μ value for the object to be measured. Or, at least a second-order estimated ε value is obtained from the second data bank with respect to the second-order estimated μ value, and a third-order estimated μ value from the first data bank with respect to the second-order estimated ε value, wherein after performing n times of estimation a n-order estimated μ value is obtained, where n is equal to or greater than 1.

Here, the measurement for the microwave material is just an example. The material suitable for use in the invention is not limited to the microwave material. The invention can generally be applied to measure the electromagnetic property of material. The electromagnetic wave as used for measurement is also corresponding to the electromagnetic material, not limiting to the microwave range.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A measuring system for electromagnetic property of material, at least suitable for use in measuring a permeability coefficient (μ) value of an object to be measured, comprising:
    a first chamber measuring apparatus, used to measure a first resonant frequency of the object to be measured at a first geometric structure, wherein the first chamber measuring apparatus comprises a chamber and a specified structural piece, wherein the chamber has a cavity inside and an electromagnetic wave access terminal that is configured to connect to the cavity, used to receive an input electromagnetic wave and output a reflective electromagnetic wave, and the specified structure piece is disposed inside the cavity with respect to the electromagnetic wave access terminal and used to produce a field region inside the cavity, wherein the region is dominated by a magnetic field and is used to adapt the object to be measured;
a second chamber measuring apparatus, used to measure a second resonant frequency of the object to be measured at a second geometric structure;
a first data bank, which comprises a plurality of first curves, wherein each of the first curves has been simulated at resonant frequencies with µ-value variances according to the first geometric structure in the first chamber measuring apparatus, wherein the first curves are respectively corresponding to different values of permittivity coefficient (ε);
a second data bank, which comprises a plurality of second curves, wherein each of the second curves has been simulated at resonant frequencies with ε-value variances according to the second geometric structure in the second chamber measuring apparatus, wherein the second curves are respectively corresponding to different values of permeability coefficient (µ); and
a processing unit, according to the first resonant frequency and the second resonant frequency and according to the first data bank and the second data bank, obtaining a first-order estimated µ value from the first data bank with respect to a given ε value, and obtaining a first-order estimated ε value from the second data bank with respect to the first-order estimated µ value, and further obtaining a second-order estimated µ value from the first data bank with respect to the first-order estimated ε value,
wherein the second-order estimated µ value serves as a measured µ value for the object to be measured, or
at least a second-order estimated ε value is obtained from the second data bank with respect to the second-order estimated µ value, and a third-order estimated µ value from the first data bank with respect to the second-order estimated ε value, wherein after performing n times of estimation a n-order estimated µ value is obtained, where n is equal to or greater than 1.

2. The measuring system as recited in claim 1, wherein a periphery of the cavity of the first chamber measuring apparatus comprises an upper surface and a lower surface, being parallel and identical shape.

3. The measuring system as recited in claim 2, wherein the specified structural piece of the first chamber measuring apparatus comprises a disc piece and a supporting cylinder to form a specific structure, wherein the region is formed at one side of the disc piece and is opposite to the electromagnetic wave access terminal.

4. The measuring system as recited in claim 1, wherein the cavity of the first chamber measuring apparatus is a cylindrical cavity.

5. The measuring system as recited in claim 4, wherein the specified structural piece of the first chamber measuring apparatus comprises a disc piece and a supporting cylinder to form a specific structure, wherein the region is formed at one side of the disc piece and is opposite to the electromagnetic wave access terminal.

6. The measuring system as recited in claim 5, wherein a shape of the object to be measured in the first chamber measuring apparatus is a hollow cylinder or a hollow disc, the supporting cylinder passes through and fixes the object to be measured.

7. The measuring system as recited in claim 1, wherein the second chamber measuring apparatus also comprises a cavity and a measuring region used to adapt the object to be measure with the second geometric structure.

8. A method for measuring electromagnetic property of material, at least suitable for measuring permeability coefficient (µ) value of an object to be measured, the method comprising:
obtaining a first chamber measuring apparatus and a second chamber measuring apparatus, wherein the first chamber measuring apparatus comprises a chamber and a specified structural piece, wherein the chamber has a cavity inside and an electromagnetic wave access terminal that is configured to connect to the cavity, used to receive an input electromagnetic wave and output a reflective electromagnetic wave, and the specified structure piece is disposed inside the cavity with respect to the electromagnetic wave access terminal and used to produce a field region inside the cavity, wherein the region is dominated by a magnetic field and is used to adapt the object to be measured;
obtaining a first data bank, wherein the first data bank is pre-established up and comprises a plurality of first curves, wherein each of the first curves has been simulated at resonant frequencies (f) with µ-value variances according to a first geometric structure in the first chamber measuring apparatus, wherein the first curves are respectively corresponding to different values of permittivity coefficient (ε) of the object to be measured;
obtaining a second data bank, wherein the first data bank is pre-established up and comprises a plurality of second curves, wherein each of the second curves has been simulated at resonant frequencies (f) with ε-value variances according to a second geometric structure in the second chamber measuring apparatus, wherein the second curves are respectively corresponding to different values of permeability coefficient (µ);
forming the object to be measured into the first geometric structure and the second geometric structure;
using the first chamber measuring apparatus to measure a first resonant frequency of the object to be measured at the first geometric structure;
using the second chamber measuring apparatus to measure a second resonant frequency of the object to be measured at the second geometric structure; and
using a processing unit, according to the first resonant frequency and the second resonant frequency and according to the first data bank and the second data bank, to obtain a first-order estimated µ value from the first data bank with respect to a given ε value, and obtain a first-order estimated ε value from the second data bank with respect to the first-order estimated µ value, and further obtain a second-order estimated µ value from the first data bank with respect to the first-order estimated ε value,
wherein the second-order estimated µ value serves as a measured µ value for the object to be measured, or
at least a second-order estimated ε value is obtained from the second data bank with respect to the second-order estimated µ value, and a third-order estimated µ value from the first data bank with respect to the second-order estimated ε value, wherein after performing n times of estimation a n-order estimated µ value is obtained, where n is equal to or greater than 1.

9. The method for measuring electromagnetic property of material as recited in claim 8,
wherein the steps to establish up the first data bank comprises simulating a µ-f curve of the resonant frequencies (f) versus µ values with respect to each one of different ε values in the first chamber measuring apparatus, and so obtaining the first curves;

wherein the steps to establish up the second data bank comprises simulating an ε-f curve of the resonant frequencies (f) versus ε values with respect to each one of different µ values in the second chamber measuring apparatus, and so obtaining the second curves.

10. The method for measuring electromagnetic property of material as recited in claim 8, wherein the step of using the processing unit comprises:

a µ-value estimation step, comprising:

determining a given ε value, given to the object to be measure; and obtaining a corresponding µ-f curve from the first data bank with respect to the given ε value as given and obtaining the estimated µ value according to the first resonant frequency;

an ε-value estimation step, comprising:

determining a given µ value, given to the object to be measure; and obtaining a corresponding ε-f curve from the second data bank with respect to the given µ value as given and obtaining the estimated ε value according to the second resonant frequency; and an iteration estimation step, comprising:

taking the estimated ε value as the given ε value to perform the µ-value estimation step; and taking the estimated µ value as the given µ value to perform the ε-value estimation step, wherein the given µ value is taken as the measured µ value according to a number of iterations as preset.

* * * * *